United States Patent
Bilewicz et al.

(10) Patent No.: US 10,288,413 B2
(45) Date of Patent: May 14, 2019

(54) APPARATUS FOR MOUNTING COMPONENTS ON A SUBSTRATE

(71) Applicant: Besi Switzerland AG, Cham (CH)

(72) Inventors: Norbert Bilewicz, Vomp (AT); Hubert Selhofer, Innsbruck (AT)

(73) Assignee: Besi Switzerland AG (CH)

( * ) Notice: Subject to any disclaimer, the term of this patent is extended or adjusted under 35 U.S.C. 154(b) by 435 days.

(21) Appl. No.: 15/278,529

(22) Filed: Sep. 28, 2016

(65) Prior Publication Data

US 2017/0092613 A1 Mar. 30, 2017

(30) Foreign Application Priority Data

Sep. 28, 2015 (CH) ...................................... 1401/15

(51) Int. Cl.
*G01B 11/00* (2006.01)
*H04N 7/18* (2006.01)
(Continued)

(52) U.S. Cl.
CPC .............. *G01B 11/14* (2013.01); *G01B 11/00* (2013.01); *G02B 17/008* (2013.01);
(Continued)

(58) Field of Classification Search
CPC ............... H01L 24/75; H01L 21/67132; H01L 21/67144; H01L 21/67259;
(Continued)

(56) References Cited

U.S. PATENT DOCUMENTS

| 5,541,834 A | 7/1996 | Tomigashi et al. |
| 5,752,446 A | 5/1998 | Squibb |
| (Continued) | | |

FOREIGN PATENT DOCUMENTS

| EP | 0 449 481 A1 | 10/1991 |
| EP | 1198979 B1 | 3/2003 |
| (Continued) | | |

OTHER PUBLICATIONS

INPI (French Patent Office), Preliminary Search Report—Documents Considered Pertinent, dated Mar. 22, 2018.
(Continued)

*Primary Examiner* — Hina F Ayub
*Assistant Examiner* — Amanda Merlino
(74) *Attorney, Agent, or Firm* — CanaanLaw, P.C.; David B. Ritchie

(57) ABSTRACT

An apparatus for mounting components on a substrate comprises a pick and place system with a bonding head, a camera and two optical deflection systems. The first optical deflection system and the camera form a first image detection system for recording an image of the substrate location on which the component is to be mounted. The first optical deflection system, the second optical deflection system and the camera form a second image detection system for recording an image of a bottom side of the component. The pick and place system moves the carriage from a take-up location of the component to the substrate location in a respective predetermined height $H_1$ above the second optical deflection system, so that the bottom side of the component is located in a focal plane of the camera, and lifts the carriage to a respective predetermined height $H_2$, so that the substrate location is situated in the focal plane of the camera.

9 Claims, 4 Drawing Sheets

Figure 1:
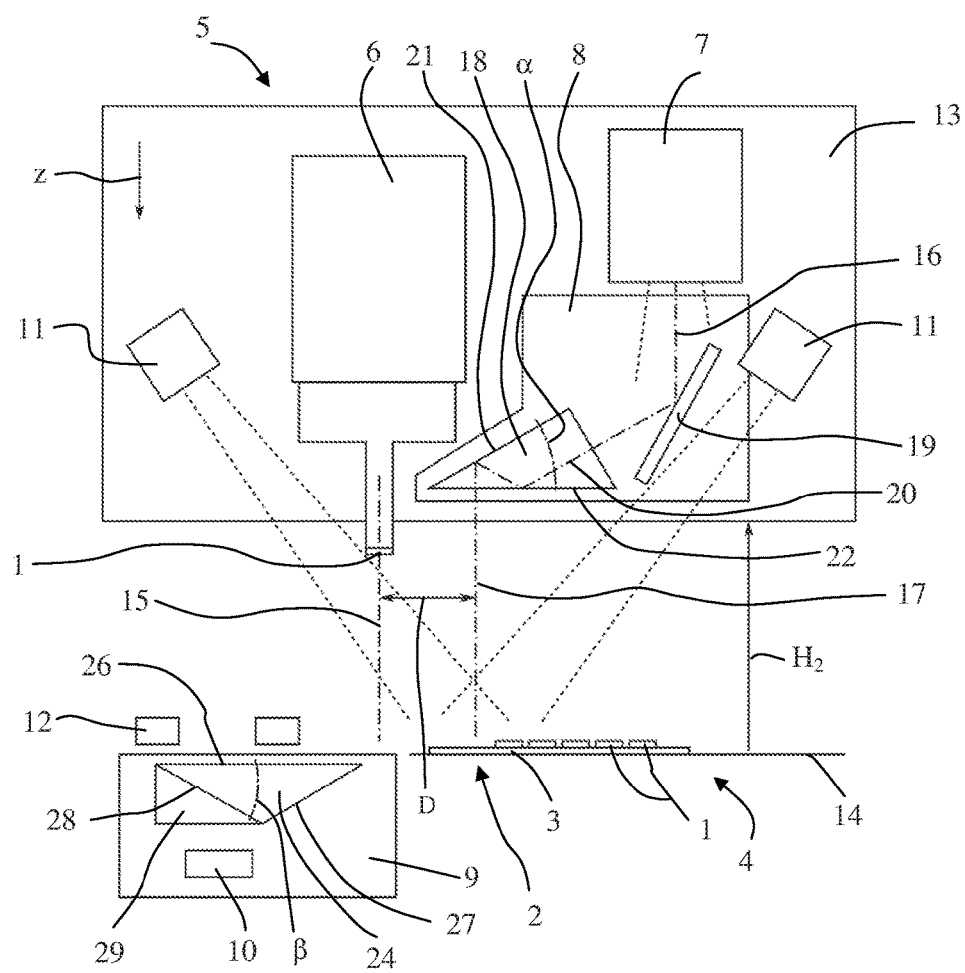

(51) Int. Cl.
    *G02B 17/00*     (2006.01)
    *G02B 27/14*     (2006.01)
    *H01L 21/67*     (2006.01)
    *H01L 23/00*     (2006.01)
    *G05B 19/406*     (2006.01)
    *G01B 11/14*     (2006.01)

(52) U.S. Cl.
    CPC ......... *G02B 27/149* (2013.01); *G05B 19/406* (2013.01); *H01L 21/67132* (2013.01); *H01L 21/67144* (2013.01); *H01L 21/67259* (2013.01); *H01L 24/75* (2013.01); *H04N 7/18* (2013.01); *G05B 2219/45031* (2013.01); *H01L 2224/7565* (2013.01); *H01L 2224/75753* (2013.01)

(58) Field of Classification Search
    CPC .. H01L 2224/7565; H01L 2224/75753; G05B 19/406; G05B 2219/45031; G02B 17/008; G02B 27/149; H04N 7/18
    See application file for complete search history.

(56) References Cited

U.S. PATENT DOCUMENTS

| | | | |
|---|---|---|---|
| 5,878,484 A | 3/1999 | Araya et al. | |
| 6,144,452 A * | 11/2000 | Hachiya | G01B 11/14 356/615 |
| 7,019,771 B1 | 3/2006 | Bollinger | |
| 2004/0036041 A1 | 2/2004 | Hoehn | |
| 2008/0083114 A1 | 4/2008 | Kim | |
| 2008/0130130 A1 | 6/2008 | Horijon | |

FOREIGN PATENT DOCUMENTS

| | | |
|---|---|---|
| EP | 1840503 A1 | 10/2007 |
| EP | 1 916 887 A1 | 4/2008 |
| EP | 2 373 145 A1 | 10/2011 |
| JP | 61-63099 A | 4/1986 |
| JP | 4-199600 A | 7/1992 |
| JP | 2005-101211 A | 4/2005 |
| JP | 2007-294727 A | 11/2007 |
| SG | 10201607243 P | 1/2019 |
| WO | 01/67831 A2 | 9/2001 |
| WO | 2004/064472 A1 | 7/2004 |

OTHER PUBLICATIONS

De Kruif et al., "Development, Integration and Qualification of a Measurement System for Accurate and Fast Placements of Flipchips", Key Engineering Materials, vol. 516, pp. 600-605, 2012.

Verstegen et al., "Design of a Novel Single Camera Vision System for Both Component and Board Alignment in Pick and Place Machines", IFAC Proceedings Volumes, vol. 39, Issue 16, pp. 706-712, 2006.

* cited by examiner

APPARATUS FOR MOUNTING COMPONENTS ON A SUBSTRATE

PRIORITY CLAIM

Applicant hereby claims foreign priority under 35 U.S.C § 119 from Swiss Application No. 1401/15 filed Sep. 28, 2015, the disclosure of which is herein incorporated by reference.

FIELD OF THE INVENTION

The invention relates to an apparatus for mounting components, typically electronic or optical components, especially semiconductor chips and flip chips, on a substrate. The mounting is also known in the field as a bonding process or placement process.

Apparatuses of this kind are especially used in the semiconductor industry. One example for such apparatuses are die bonders or pick and place machines, with which components in the form of semiconductor chips, micromechanical and micro-optical components and the like are placed and bonded on substrates such as for example lead frames, printed circuit boards, ceramics etc. The components are taken up at a take-up location by a bonding head, especially sucked up, moved to a substrate location and placed at a precisely defined position on the substrate. The bonding head is a part of a pick and place system which allows movements of the bonding head in at least three spatial directions. In order to ensure that the placement of the component on the substrate can occur in a precise way with respect to position, it is necessary to determine both the precise position of the component gripped by the bonding head with respect to the positioning axis of the bonding head and also the precise position of the substrate location.

Such apparatuses, in which two mirrors are used which are twisted in relation to the vertical about 45° in order to project the bottom side of the component to a camera, so that the position of the component can then be determined in relation to the positioning axis of the bonding head, are known from EP 449481, U.S. Pat. No. 5,878,484, WO 2004064472 and EP 1916887. An apparatus in which a mirror and a pentagonal prism are used in order to project the bottom side of the component to the camera is known from EP 2373145. In these apparatuses, the optical axis of the camera extends parallel to the positioning axis of the bonding head. In the apparatus of EP 2373145, only the position of the component is determined, but not the position of the substrate location.

In industrially employed apparatuses of recent design, two cameras are usually used, namely one camera which is arranged in or beneath the substrate plane and which is directed upwardly for determining the position of the component, and one camera which is arranged above the substrate plane and which is directed downwardly for determining the position of the substrate location. A relevant disadvantage of these apparatuses is that the bonding head needs to travel at first from the take-up location to the camera arranged in or beneath the substrate plane and then further to the substrate location, which often requires a detour.

BRIEF DESCRIPTION OF THE INVENTION

The invention is based on the object of developing an apparatus which requires only one camera for determining the position of the component and for determining the position of the substrate location, and which offers a simple optical construction and requires little space.

BRIEF DESCRIPTION OF THE DRAWING FIGURES

Figure 2:
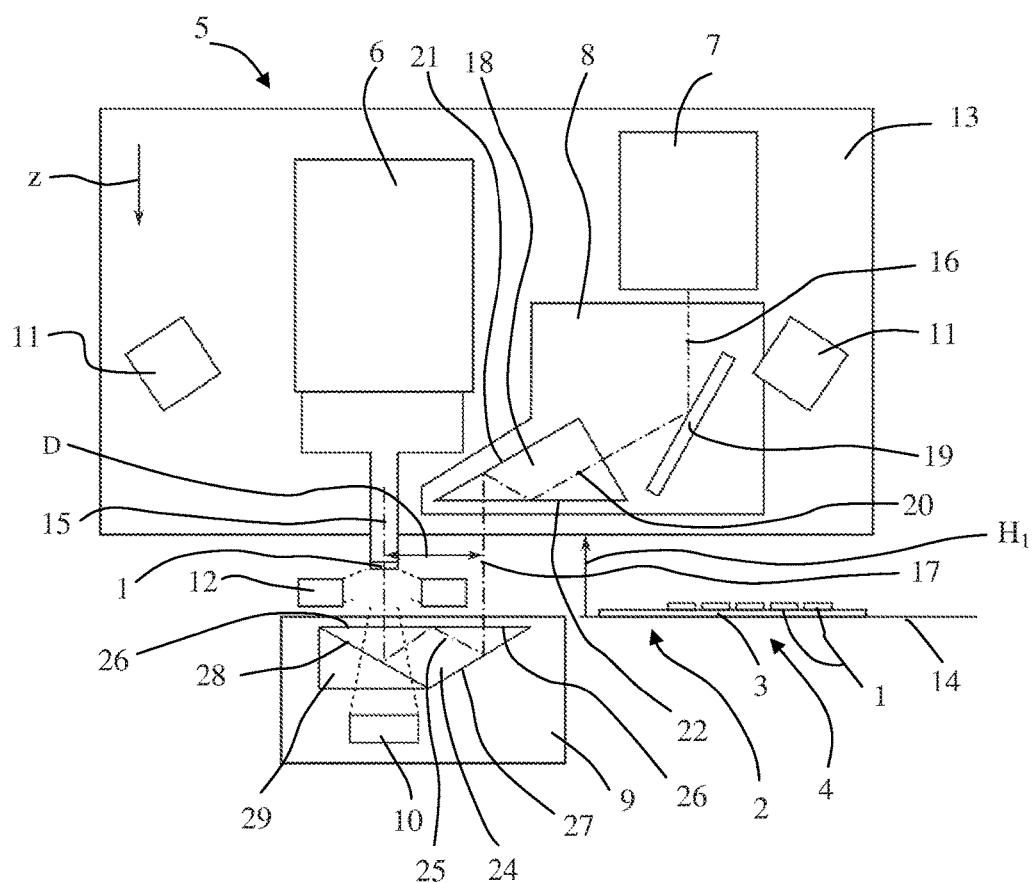
Figure 3:
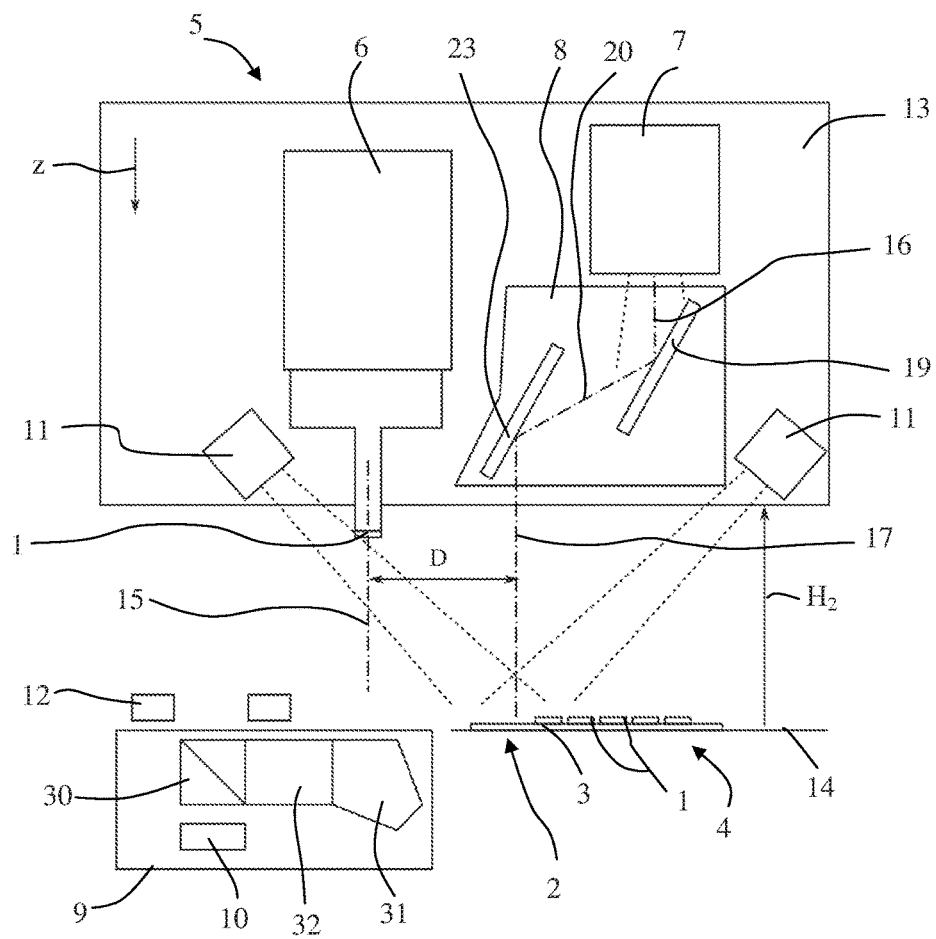
Figure 4:
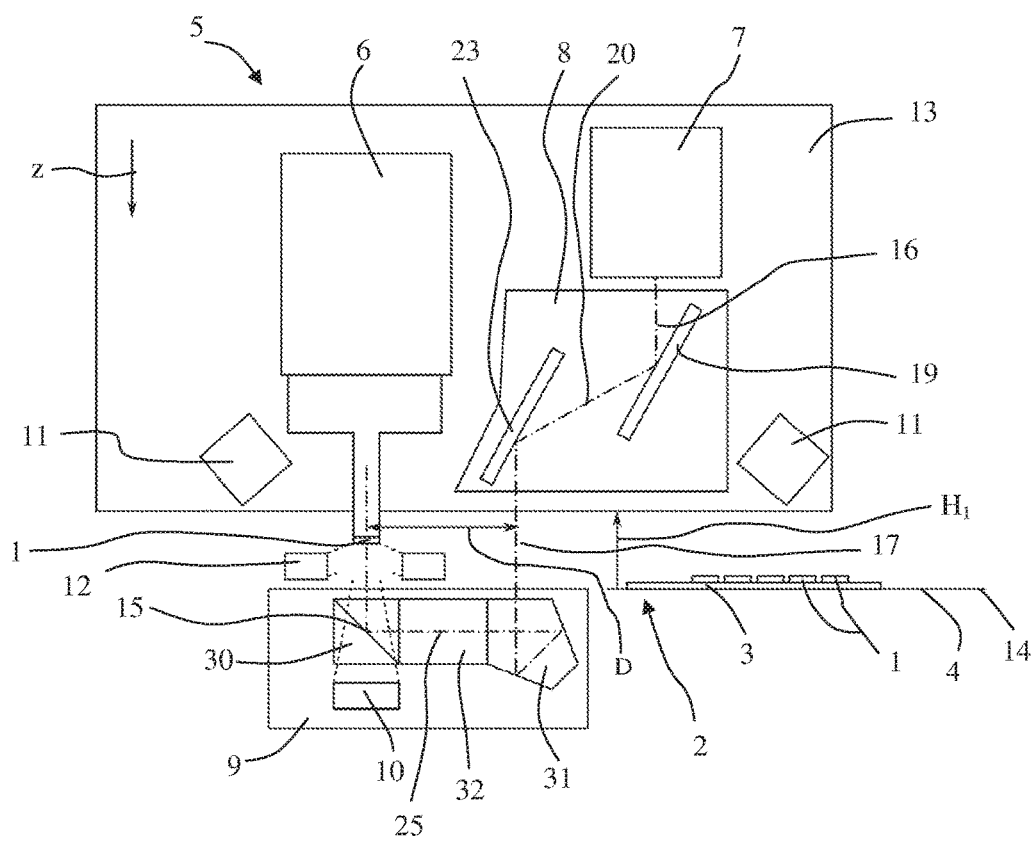

The accompanying drawings, which are incorporated into and constitute a part of this specification, illustrate one or more embodiments of the present invention and, together with the detailed description, serve to explain the principles and implementations of the invention. The figures are shown schematically and not drawn to scale. In the drawings:

FIGS. 1 and 2 show two snapshots of an apparatus in accordance with the invention for the mounting of components, and FIGS. 3 and 4 show alternative embodiments of individual optical deflection systems.

DETAILED DESCRIPTION OF THE INVENTION

FIGS. 1 and 2 schematically show side views of two snapshots of an apparatus in accordance with the invention for mounting components 1 on the substrate locations 2 of a substrate 3. The components are typically electronic, micromechanical or (micro-) optical components, especially semiconductor chips and flip chips. The apparatus comprises a support 4 for the substrate 3, a pick and place system 5 with a bonding head 6, a single camera 7, a first optical deflection system 8, a second optical deflection system 9, a first light source 10, a second light source 11 and a third light source 12. The bonding head 6, the first optical deflection system 8, the camera 7 and the second light source 11 are fastened to a common carriage 13. The second optical deflection system 9 is arranged in a stationary manner on the apparatus. The substrates 3 usually have a plurality of substrate locations. The term "substrate location 2" shall generally be understood below as the substrate location which is situated in the field of vision of the camera 7, wherein the beam path from the substrate location 2 to the camera 7 extends through the first optical deflection system 8 and is deflected therein at least once.

The surface of the support 4 for the substrate 3 defines a substrate plane 14. The pick and place system 5 comprises at least three drives in order to move the carriage 13 in three spatial directions, namely in two directions which extend parallel to the substrate plane 14, and in a direction designated here as Z-direction, which extends perpendicularly to the substrate plane 14. The bonding head 6 comprises a gripping axis 15 which extends in the Z-direction.

The camera 7 and the first optical deflection system 8 jointly form a first image detection system, which allows recording an image of the substrate location 2 on which the component 1 is to be mounted. The camera 7, the first optical deflection system 8 and the second optical deflection system 9 jointly form a second image detection system which allows recording an image of the bottom side of the component 1 held by the bonding head 6.

The pick and place system 5 is set up to take up a respective component 1 by means of the bonding head 6 at a take-up location and to place said component on a substrate location 2. In order to thus enable highly precise positioning, the camera 7 records an image of the bottom side of the component 1 on the one hand and an image of the substrate location 2 on which the component 1 is to be placed on the other hand.

The first optical deflection system 8 is used to bring the optical axis 16 of the camera 7, which extends in a laterally offset manner in relation to the gripping axis 15 of the bonding head 6 in the Z-direction, as optical axis 17 closer to the gripping axis 15 of the bonding head 6. The object-side optical axis 17 of the first image detection system extends at a distance D from the gripping axis 15 of the bonding head 6 due to the first optical deflection system 8, which distance D is considerably lower than the distance between the gripping axis 15 of the bonding head 6 and the optical axis 16 of the camera 7.

The second optical deflection system 9 and the first optical deflection system 8 cooperate and bring the bottom side of the component 1 held by the bonding head 6 into the field of vision of the camera 7 as long as the bonding head 6 is situated in a predetermined working area above the second optical deflection system 9.

In order to allow the camera 7 to record a sharp image of the bottom side of the component 1 as well as the substrate location 2 on which the component 1 is to be placed, the optical paths of the beam paths of the first image detection system and the second image detection system must be equally long to the highest possible extent. The adjustment of the length of the beam paths occurs by displacing the carriage 13 of the pick and place system 5 in the Z-direction. The apparatus is thus programmed such that for recording an image of the component 1 the carriage 13 is moved in the Z-direction to a predetermined height $H_1$ above the substrate plane 14 over the second optical deflection system 9, so that the bottom side of the component 1 is located in the focal plane of the camera 7 at least during its travel over the second optical deflection system 9, so that the camera 7, during the displacement of the component 1, is able to record a sharp image of the bottom side of the component 1, and to lift the carriage 13 to a predetermined height $H_2$ above the substrate plane 14 for recording an image of the substrate location 2, so that the substrate location 2 is located in the focal plane of the camera 7, so that the camera 7 can record a sharp image of the substrate location 2. The two heights $H_1$ and $H_2$ are dimensioned in such a way that the optical length of the beam path between the bottom side of the component 1 and the camera 7 and the optical length of the beam path between the substrate location 2 and the camera 7 are equally large, so that either the bottom side of the component 1 or the substrate location 2 is in the focal plane of the camera 7. It applies that $H_2 > H_1$, as is shown in FIGS. 1 and 2.

The apparatus can be programmed in the respect that an image is recorded first from each of the substrate locations 2 of a substrate 3 and one component 1 after the other is mounted on the substrate locations 2 of the substrate 3. But it can also be programmed to record an image of the bottom side of the component 1 and then an image of the associated substrate location 2 during each mounting process.

FIG. 1 shows the apparatus in the state in which the carriage 13 is situated at the predetermined height $H_2$ at a position in which a predetermined substrate location 2 is in the field of vision of the camera 7, so that the camera 7 is capable of recording a sufficiently sharp image of said substrate location 2.

FIG. 2 shows the apparatus in the state in which the carriage 13 is situated at the predetermined height $H_1$ and within the working area of the second optical deflection system 9, so that the bottom side of the component 1 is in the field of vision of the camera 7, so that the camera 7 is capable of recording a sufficiently sharp image of the bottom side of the component 1.

According to a first embodiment, the first optical deflection system 8 comprises a deflecting prism 18 and a mirror 19. The deflecting prism 18 is a body which is triangular in its cross-section and which reflects a light beam 20 originating from the substrate plane in the Z-direction on two surfaces 21 and 22. The bottom surface 22 of the triangular deflecting prism 18, on which the light beam 20 is subjected to the second reflection, extends parallel to the substrate plane 14. The second surface 21, on which the light beam 20 is subjected to the first reflection, is mirrored and encloses a predetermined angle α with the bottom surface 22. The angle α is determined in such a way that the light beam 20 is reflected totally at the reflection on the bottom surface 22. In order to ensure that total reflection occurs, the angle α must fulfil Snell's law of refraction:

$$\alpha < 90° - \arcsin(n(\text{air})/n(\text{deflecting prism 18}))$$

wherein n(air) designates the refractive index of air and n(deflecting prism 18) the refractive index of the material of which the deflecting prism 18 consists.

According to a first embodiment, the second optical deflection system 9 comprises a symmetric deflecting prism 24 which reflects the light beam 25 originating from the bottom side of the component 1 in the direction of the gripping axis 15 three times until it again leaves the deflecting prism 24 parallel to the gripping axis 15 and impinges on the first optical deflection system 8. The light source 10 is arranged on the one side of the deflecting prism 24 beneath the deflecting prism 24. The deflecting prism 24 is in cross-section an isosceles triangle with three surfaces 26 to 28 whose angle β is selected in such a way that the light beam 25 is reflected totally on the upper surface 26. The angle $_R$ must therefore fulfil the condition $$\beta < 90° - \arcsin(n(\text{air})/n(\text{deflecting prism 24})).$$

Due to the total reflection, no silvering of the upper surface 26 is necessary, so that the light reflected on the component 1 can enter the deflecting prism 24, is reflected in the interior on all three surfaces 26 to 28, can leave the deflecting prism 24 again and can then be conducted by means of the first optical deflection system 8 to the camera 7.

The surface 27 is advantageously formed in a silvered manner. If the light source 10 for the illumination of the bottom side of the component 1 held by the bonding head 6 is present, the surface 28 is not exposed, but a further triangular body 29 forms a beam splitter with a portion of the deflecting prism 24. Beam splitting occurs on the surface 28, e.g. as usual via frustrated total reflection. The surface 28 acting as the beam splitter layer can also be formed as a polkadot. A polkadot is a pattern which consists of reflection points arranged in the manner of an array.

According to a second embodiment, the first optical deflection system 8 comprises, as shown in FIGS. 3 and 4, a mirror 23 instead of the deflecting prism 18, which mirror encloses an angle with the vertical. This embodiment requires more space than the first embodiment, which leads to the consequence that the distance D between the gripping axis 15 of the bonding head 6 and the optical axis 17 is greater than in the first embodiment because already the required material thickness of the mirror 22 increases the distance D. The mirrors 19 and 23 can be inclined by 45°, but also by more than 45° or less than 45°, in relation to the vertical. However, this leads to a higher need for space of the mirror 19 downwardly in the direction of the substrate plane 14 or the mirror 23 in the direction of the bonding head 6.

The second optical deflection system 9 comprises according to a second embodiment and as also shown in FIGS. 3 and 4 a beam splitter cube 30, a pentagonal prism 31 and, optionally, an optically transparent body 32 which is preferably seamlessly arranged between the beam splitter cube 30 and the pentagonal prism 31. The light beam 25 which originates from the bottom side of the component 1 is deflected by 90° in the beam splitter cube 30, reflected on two surfaces in the pentagonal prism 31 and deflected thereby in total by a further 90°, so that the light beam emitting from the pentagonal prism 31 extends parallel to the gripping axis 15 of the bonding head 6 and parallel to the optical axis 16 of the camera 7. The body 32 reduces the optical path and prevents reflections of the light beam 25 both during exit from the beam splitter cube 30 and also during entry into the pentagonal prism 31 when it is inserted seamlessly between said two elements and consists of the same material.

The optical components of the two deflection systems 8 and 9 consist of transparent material, preferably glass or transparent plastic with a relatively high refractive index.

The light sources 10 and 12 are used for illuminating the bottom side of the component 1. The light source 10 is preferably arranged beneath the beam splitter cube 30. The beam splitter cube 30 is thus used for injecting the light emitted by the light source 10 and for decoupling the light reflected on the bottom side of the component 1. The light source 10 illuminates the bottom side of the component 1 in a manner coaxial to the optical axis 16 in order to optimally illuminate in particular components 1 with a smooth, mirroring bottom side, whereas the light source 12 is formed as a lateral light for the optimal illumination of components 1 with a rough, diffusely scattering bottom side.

The light source 11 is used for illumination of the substrate location 2. The light source 11 preferably comprises lighting means which are preferably arranged on all sides around the optical axis 17 of the first image detection system and which illuminate the substrate location to be illuminated in the manner of a lateral light. It can additionally comprise coaxial illumination.

The camera 7 can record the image of the bottom side of the component 1 either during the travel of the bonding head 6 over the second optical deflection system 9, i.e. without stopping, or the apparatus can stop the bonding head 6 above the second optical deflection system 9 in order to record the image.

In all embodiments, the mirror 19 can be omitted and the camera 7 can be arranged (in a twisted manner) in such a way that its optical axis 16 coincides with the direction which the light beam 20 assumes after the reflection on the deflecting prism 18 or on the mirror 23.

The invention offers at least the following advantages:

Only one single camera is necessary in order to determine both the precise position of the component gripped by the bonding head and also the precise position of the substrate location.

The first optical deflection system moves the optical axis of the camera closer to the gripping axis of the bonding head and thus increases the working range of the machine.

The first optical deflection system leads to a reduction in the optical path length from the bottom side of the component to the camera and thus reduces the difference between the heights $H_1$ and $H_2$ which is necessary for the adjustment of the focal plane of the camera.

The second optical deflection system allows a recording of the bottom side of the component during travel without having to stop the bonding head for this purpose. This is because the image of the bottom side of the component seemingly stands still as long as the component is located in a predetermined working area of the second optical deflection system.

The first optical deflection system is rigidly connected to the bonding head, and the second optical deflection system is arranged in a stationary manner on the machine. Displacements of the one or the other deflection system or parts thereof during the bonding process are thus unnecessary.

The heights $H_1$ and $H_2$ can be adjusted to the specific requirements of the mounting apparatus via the selection of the geometry and the material of the element 24 or the elements 30, 31 and 32.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. An apparatus for mounting components on a substrate, comprising
   a support for the substrate, wherein a surface of the support defines a substrate plane,
   a pick and place system with a bonding head, wherein the pick and place system is set up to take up a component with the bonding head at a take-up location and to place said component on a substrate location,
   a camera for detecting a position of the component held by the bonding head and for detecting a position of the substrate location on which the component is to be mounted,
   a first optical deflection system, and
   a second optical deflection system,
   wherein
   the camera has an optical axis,
   the pick and place system comprises a displaceable carriage on which the first optical deflection system, the camera and the bonding head are fastened,
   the second optical deflection system is arranged in a stationary manner on the apparatus, the first optical deflection system and the camera form a first image detection system for recording an image of the substrate location, wherein an object-side optical axis of the first image detection system extends at a distance from a gripping axis of the bonding head which is smaller than a distance between the gripping axis of the bonding head and the optical axis of the camera,
   the first optical deflection system, the second optical deflection system and the camera form a second image detection system for recording an image of a bottom side of the component, and
   the apparatus is programmed, for the recording of an image of the component, to move the carriage during the transport of the component from the take-up location to the substrate location at a predetermined height $H_1$ above the substrate plane over the second optical deflection system, so that the bottom side of the component, during the travel over the second optical deflection system, is located in a focal plane of the camera, and
   for the recording of an image of the substrate location to lift the carriage to a predetermined height $H_2$ above the substrate plane, so that the substrate location is located in the focal plane of the camera, wherein the two heights $H_1$ and $H_2$ are dimensioned in such a way that the optical length of the beam path between the bottom side of the component and the camera and the optical length of the beam path between the substrate location and the camera are equally large.

2. The apparatus according to claim 1, wherein the first optical deflection system comprises a deflecting prism and a mirror.

3. The apparatus according to claim 2, wherein the second optical deflection system comprises a symmetric deflecting prism.

4. The apparatus according to claim 2, wherein the second optical deflection system comprises a beam splitter cube, a pentagonal prism and an optically transparent body which is seamlessly arranged between the beam splitter cube and the pentagonal prism.

5. The apparatus according to claim 1, wherein the first optical deflection system comprises two mirrors.

6. The apparatus according to claim 5, wherein the second optical deflection system comprises a symmetric deflecting prism.

7. The apparatus according to claim 5, wherein the second optical deflection system comprises a beam splitter cube, a pentagonal prism and an optically transparent body which is seamlessly arranged between the beam splitter cube and the pentagonal prism.

8. The apparatus according to claim 1, wherein the second optical deflection system comprises a symmetric deflecting prism.

9. The apparatus according to claim 1, wherein the second optical deflection system comprises a beam splitter cube, a pentagonal prism and an optically transparent body which is seamlessly arranged between the beam splitter cube and the pentagonal prism.

* * * * *